(12) United States Patent
Hayasaka et al.

(10) Patent No.: US 8,456,565 B2
(45) Date of Patent: Jun. 4, 2013

(54) IMAGING DEVICE

(75) Inventors: Kengo Hayasaka, Tokyo (JP); Kenji Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 419 days.

(21) Appl. No.: 12/767,482

(22) Filed: Apr. 26, 2010

(65) Prior Publication Data

US 2010/0283884 A1 Nov. 11, 2010

(30) Foreign Application Priority Data

May 8, 2009 (JP) ................................ P2009-113943

(51) Int. Cl.
*H04N 5/225* (2006.01)
(52) U.S. Cl.
USPC .......................................... 348/340; 348/335
(58) Field of Classification Search
USPC ........................... 348/335, 340, 343, 345, 369
See application file for complete search history.

(56) References Cited

U.S. PATENT DOCUMENTS

| 2007/0014019 A1* | 1/2007 | Mouli ........................... 359/619 |
| 2009/0027542 A1* | 1/2009 | Yamamoto et al. ........... 348/340 |
| 2009/0128658 A1* | 5/2009 | Hayasaka et al. .......... 348/222.1 |
| 2009/0140131 A1* | 6/2009 | Utagawa ....................... 250/226 |

FOREIGN PATENT DOCUMENTS

WO 2006-039486 A2 4/2006

OTHER PUBLICATIONS

Ren. Ng, et al., "Light Field Photography with a Hand-Held Plenoptic Camera", Stanford Tech Report CTSR Feb. 2005.

* cited by examiner

*Primary Examiner* — Sinh Tran
*Assistant Examiner* — Selam Gebriel
(74) *Attorney, Agent, or Firm* — K&L Gates LLLP (57) ABSTRACT

Disclosed herein is an imaging device including: an imaging lens configured to have an aperture stop; an imaging element configured to include a plurality of pixels two-dimensionally arranged along a longitudinal direction and a lateral direction and acquire imaging data based on received light; and a microlens array configured to be disposed between the imaging lens and the imaging element and include a plurality of microlenses, a pixel area composed of m×n pixels (m and n denote a number equal to or larger than 2 in the longitudinal direction and the lateral direction) in the imaging element being assigned to a respective one of the microlenses, wherein positional displacement smaller than a width of one pixel is set between the microlens and the pixel area.

8 Claims, 9 Drawing Sheets

IMAGING DEVICE

CROSS REFERENCES TO RELATED APPLICATIONS

The present application claims priority to Japanese Priority Patent Application JP 2009-113943 filed in the Japan Patent Office on May 8, 2009, the entire content of which is hereby incorporated by reference.

BACKGROUND

The present application relates to an imaging device employing microlenses.

Various imaging devices have been proposed and developed. Furthermore, there have also been proposed imaging devices that execute predetermined image processing for imaging data obtained by imaging and output the resulting data.

For example, PCT Patent Publication No. WO06/039486 brochure and Ren. Ng and other seven co-authors, "Light Field Photography with a Hand-Held Plenoptic Camera," Stanford Tech Report CTSR 2005-02 propose an imaging device employing a technique called "light field photography." In this imaging device, a microlens array is disposed at the image forming plane for an imaging object by an imaging lens, and an imaging element is provided at the focal position of this microlens array. The microlens array is so disposed that plural pixels on the imaging element are assigned to each of the microlenses in the microlens array. Due to this feature, the imaging data acquired in the imaging element holds information on the traveling directions of light rays as well as the intensity distribution of the light rays. Such imaging data is subjected to predetermined image processing to thereby be reconstructed as an observation image from an arbitrary viewpoint (hereinafter, referred to simply as the parallax image) or an observation image at an arbitrary focal point.

SUMMARY

The number of pixels (two-dimensional resolution) of the reconstructed image is equal to the number of lenses in the microlens array. This is because the information on the two-dimensional coordinates of the reconstructed image depends on the coordinates of the microlens array. In other words, the number of pixels of the reconstructed image is equal to the value obtained by dividing the number of all pixels of the imaging element by the number of pixels assigned to each microlens (hereinafter, referred to simply as the lens-assignment pixels). On the other hand, the number of lens-assignment pixels is equal to the resolution of the angular information of the light ray, i.e. the resolution of the arbitrary viewpoint or focal point of the reconstructed image. Therefore, these resolutions and the number of pixels of the reconstructed image are in a trade-off relationship.

For example, when it is desired to acquire a parallax image of high resolution as the reconstructed image, it is preferable that the number of lens-assignment pixels be as small as possible. Furthermore, when the parallax image is used for three-dimensional displaying of e.g. the stereo system, the number of lens-assignment pixels is frequently set to a comparatively-small number such as 2×2 or 3×3 because it is sufficient that right and left two parallax images can be acquired as the images for the right eye and the left eye.

However, if the number of lens-assignment pixels is reduced, the imaging becomes more susceptible to vignetting and shading due to the main lens and the influence due to the edge of the microlens, such as ghost, and thus it becomes difficult to acquire the light ray data of the desired viewpoint with high accuracy. This leads to the image quality deterioration of the generated parallax image. In particular, if the number of lens-assignment pixels is set to 2×2 (4), the image data of all of four pixels need to be extracted and thereafter integration processing needs to be executed by using these image data in order to obtain the above-described right and left parallax images with reduction of the influence due to the edge of the microlens. This causes disadvantages e.g. that the depth of field of the parallax images is lowered due to the integration processing as well as that the number of steps of the processing for acquiring the parallax images is increased. Consequently, it is desired to realize an imaging device capable of acquiring the light ray data of the desired viewpoint with high accuracy and efficiency.

There is a need for the present invention to provide an imaging device capable of acquiring the light ray data of the desired viewpoint with high accuracy and efficiency.

According to an embodiment, there is provided an imaging device including an imaging lens configured to have an aperture stop, an imaging element configured to include a plurality of pixels two-dimensionally arranged along a longitudinal direction and a lateral direction and acquire imaging data based on received light, and a microlens array configured to be disposed between the imaging lens and the imaging element and include a plurality of microlenses. A pixel area composed of m×n pixels (m and n denote a number equal to or larger than 2 in the longitudinal direction and the lateral direction) in the imaging element is assigned to a respective one of the microlenses. Positional displacement smaller than the width of one pixel is set between the microlens and the pixel area.

In the imaging device according to an embodiment, the microlens array is disposed between the imaging lens and the imaging element, and the predetermined pixel area is assigned to each of the microlenses in this microlens array. Due to this feature, the light ray passing through a respective one of the microlenses is received by the imaging element in such a way that information on the traveling directions of the light rays as well as the intensity distribution of the light rays is held. Because the positional displacement smaller than the width of one pixel is set between the microlens and the pixel area, the influence due to the edge of the microlens is reduced and only the necessary pixel data are read out through decimation. Thus, the speed of the readout processing is increased.

In the imaging device according to an embodiment, the microlens array is provided between the imaging lens and the imaging element, and the predetermined pixel area is assigned to each microlens. Thus, the light rays from the imaging object can be received as light ray vectors whose viewpoints are different from each other. Because the positional displacement smaller than the width of one pixel is set between the microlens and the pixel area, the light ray data of the desired viewpoint can be acquired with high accuracy and efficiency.

Additional features and advantages are described herein, and will be apparent from the following Detailed Description and the figures.

DETAILED DESCRIPTION

The present application will be described in detail below with reference to the drawings according to an embodiment. The description will be made in the following order.

1. First Embodiment (example in which the number of lens-assignment pixels is 3×3 and the positional displacement between the microlens and the pixel is set along the lateral direction)

2. Modification Example 1 (example in which the positional displacement is set along the longitudinal direction)

3. Modification Example 2 (example in which the positional displacement is set along an oblique direction)

4. Second Embodiment (example in which the number of lens-assignment pixels is 2×2 and the positional displacement between the microlens and the pixel is set along the longitudinal direction)

5. Modification Example 3 (example in which the positional displacement is set along the lateral direction)

First Embodiment (Configuration Example of Imaging Device 1)

Figure 1:
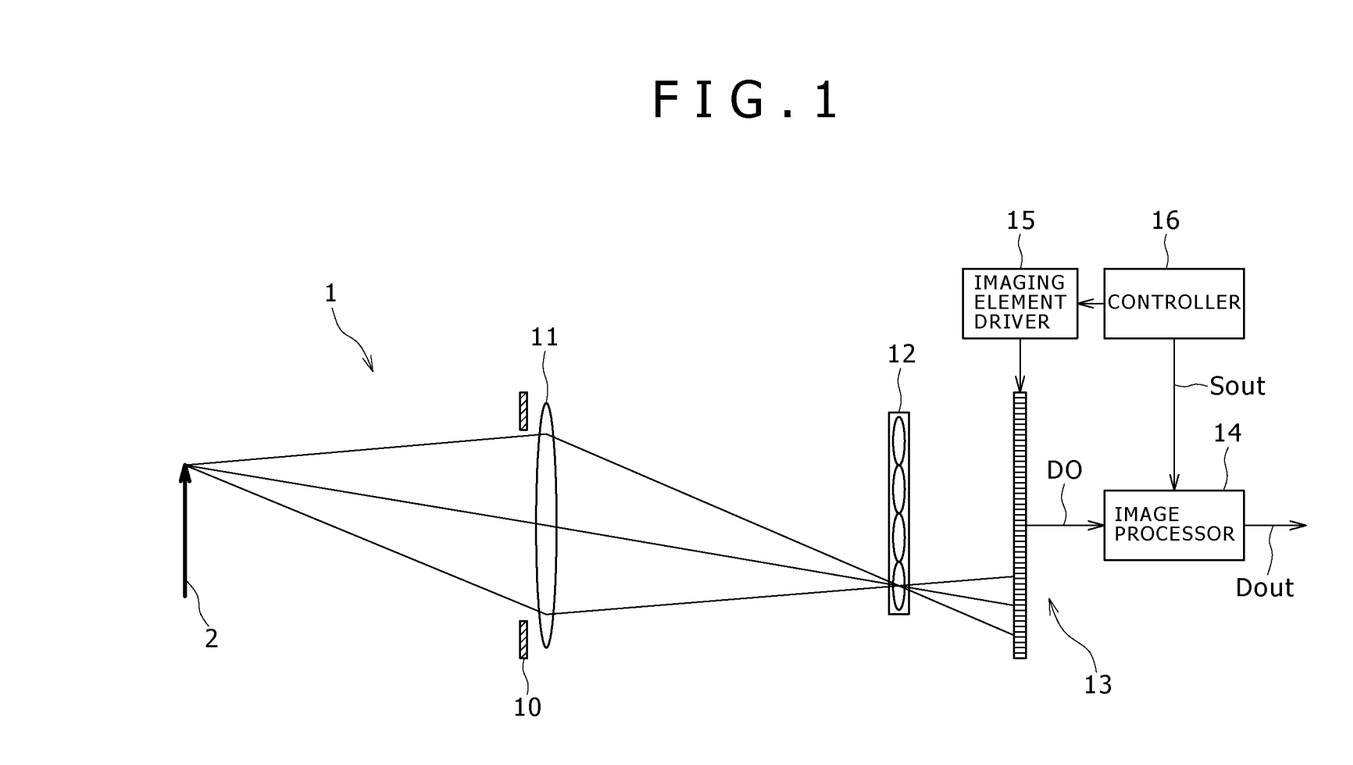
FIG. 1 is a diagram showing the entire configuration of an imaging device according to a first embodiment.

FIG. 1 shows the entire configuration of an imaging device 1 according to a first embodiment. The imaging device 1 performs imaging for an imaging object 2 and executes predetermined image processing to thereby output image data Dout. This imaging device 1 includes an imaging lens 11, a microlens array 12, an imaging element 13, an image processor 14, an imaging element driver 15, and a controller 16.

The imaging lens 11 is the main lens for the imaging of the imaging object 2 and is formed of e.g. a general imaging lens used in a video camcorder, a still camera, and so on. An aperture stop 10 is disposed on the light incidence side of this imaging lens 11.

The microlens array 12 is obtained by forming plural microlenses on a substrate such as glass. The microlens array 12 is disposed at the focal plane (image forming plane) of the imaging lens 11, and the imaging element 13 is disposed at the focal position of the microlenses. Each of the microlenses is formed of e.g. a solid-state lens, a liquid crystal lens, or a diffractive lens.

The imaging element 13 receives light rays from the microlens array 12 and acquires imaging data D0. This imaging element 13 includes plural pixels two-dimensionally arranged in a matrix (along the longitudinal direction and the lateral direction). Each pixel is formed of a solid-state imaging element such as a charge coupled device (CCD) or a complementary metal-oxide semiconductor (CMOS). In the imaging element 13, in the pixel area corresponding to the two-dimensional coordinates of the microlenses in the microlens array 12, the image of the imaging object 2 is formed as an image having a shape similar to the opening shape of the aperture stop 10 (e.g. a circular shape).

Each one microlens of the microlens array 12 is assigned to the pixel area composed of m×n pixels (m and n denote a number equal to or larger than 2 in the longitudinal direction and the lateral direction, and 3×3 in the present embodiment) of the plural pixels. As the value of m×n becomes larger, i.e. as the number of pixels assigned to one microlens (hereinafter, referred to as the lens-assignment pixels) becomes larger, e.g. the angular resolution of a parallax image to be described later becomes higher. On the other hand, as the number of lens-assignment pixels becomes smaller (the value of m×n becomes smaller), the number of pixels (two-dimensional resolution) of the parallax image becomes larger. As just described, the angular resolution of the parallax image and the two-dimensional resolution thereof are in a trade-off relationship. In the present embodiment, the number of lens-assignment pixels is 3×3 (9).

On the light receiving plane of this imaging element 13, a color filter (not shown in FIG. 1) formed by regularly arranging filters of plural colors is provided. As the color filter, e.g. one formed by arranging filters of primary colors of red (R), green (G), and blue (B) at a predetermined ratio is used. The color coding of this color filter may be set on either a pixel-by-pixel basis or a microlens-by-microlens basis.

(Alignment Relationship between Imaging Element and Microlens)

Figure 2:
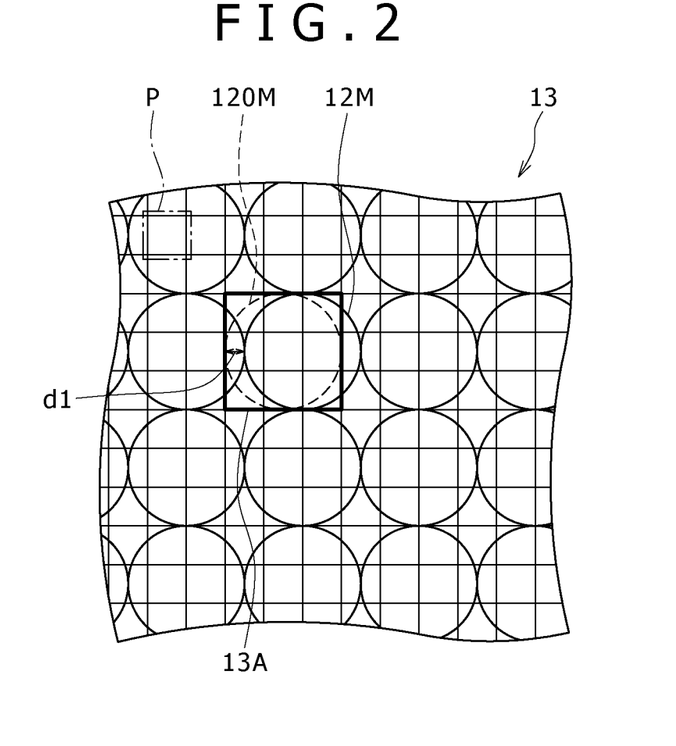
FIG. 2 is a schematic diagram for explaining the alignment relationship between an imaging element and a microlens shown in FIG. 1.

The alignment relationship between the imaging element 13 and the microlens will be described below with reference to FIG. 2. For the imaging element 13, if the number of lens-assignment pixels is 3×3, generally the microlens (microlens 120M) is so disposed as to involve no positional displacement relative to a pixel area 13A surrounded by the heavy-line frame in FIG. 2 for example. Due to this configuration, the light ray passing through a respective one of the microlenses is received by each of nine pixels in the pixel area 13A.

In the present embodiment, positional displacement d1 is set between the pixel area 13A composed of 3×3 pixels and the microlens (microlens 12M). Specifically, the microlens 12M is disposed in such a state as to be displaced along the lateral direction (in this configuration, the horizontal direction) relative to the pixel area 13A. The magnitude (displacement width) of this positional displacement d1 is set to e.g. 0.5 Pw (Pw: pixel width). It is preferable that the displacement width be 0.5 Pw. However, the displacement width is not limited thereto as long as it is smaller than the width of one pixel.

The image processor 14 executes predetermined image processing for the imaging data D0 obtained by the imaging element 13 and outputs the image data Dout as e.g. a parallax image. The specific image processing operation of this image processor 14 will be described later.

The imaging element driver 15 drives the imaging element 13 and controls the light reception operation of the imaging element 13.

The controller 16 controls the operation of the image processor 14 and the imaging element driver 15 and is formed of e.g. a microcomputer.

(Operation and Effects of Imaging Device 1)

The imaging operation (light reception operation) and the image processing operation in the imaging device 1 will be described below. As the image processing, parallax image generation processing of generating parallax images of right and left two viewpoints for the purpose of three-dimensional displaying will be described as an example.

(Imaging Operation)

Figure 3:
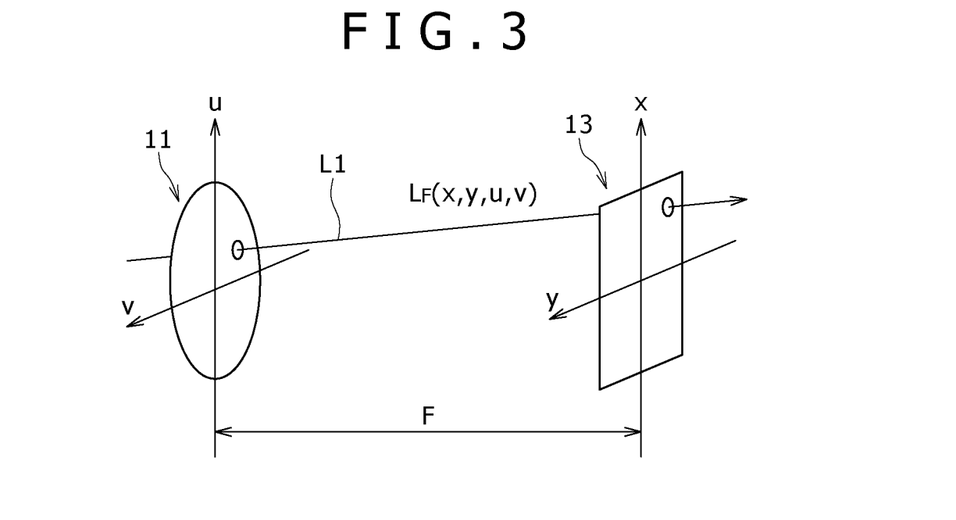
FIG. 3 is a diagram for explaining a light ray received on the imaging element.

In the imaging device 1, the microlens array 12 is provided at a predetermined position between the imaging lens 11 and the imaging element 13. Due to this feature, the light rays from the imaging object 2 are recorded as light ray vectors that hold information on the traveling directions of the light rays as well as the intensity distribution of the light rays in the imaging element 13. Specifically, as shown in FIG. 3, if an orthogonal coordinate system $(u, v)$ is assumed on the lens plane of the imaging lens 11 and an orthogonal coordinate system $(x, y)$ is assumed on the imaging plane of the imaging element 13, a light ray L1 passing through the imaging lens 11 and the imaging element 13 is represented by a four-dimensional function $L_F(x, y, u, v)$. In the imaging element 13, the light ray data is read out on a pixel-by-pixel basis in response to the driving operation by the imaging element driver 15, so that the imaging data D0 is acquired.

Figure 4:
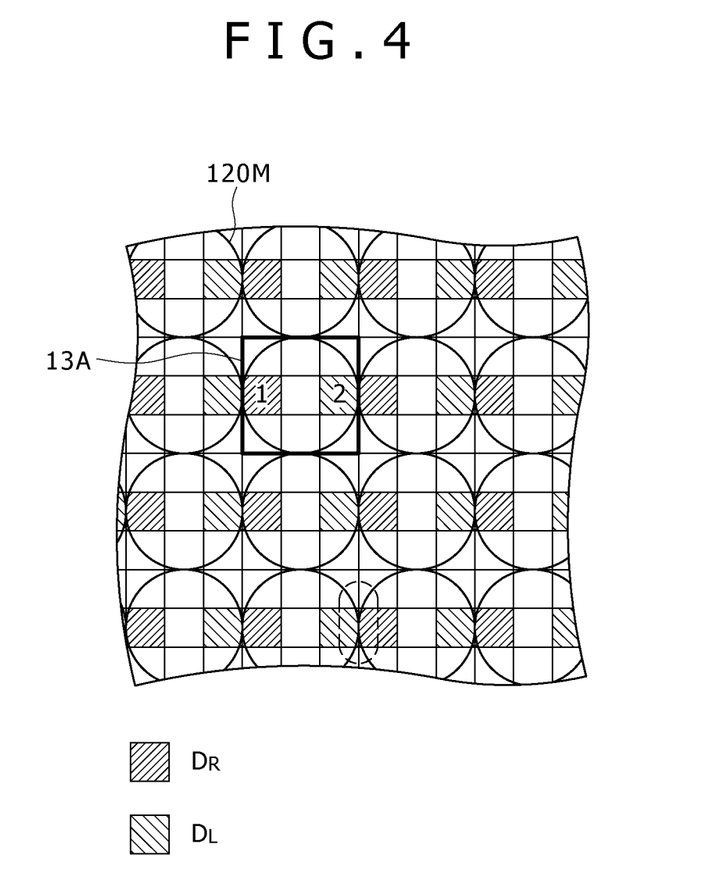
FIG. 4 is a schematic diagram showing light receiving areas of right and left viewpoints in the imaging element according to comparative example 1.

The image of the imaging object 2 by the imaging lens 11 is formed on the imaging element 13 on a microlens-by-microlens basis corresponding to the two-dimensional coordinates of the microlenses in the microlens array 12. Light receiving areas when the number of lens-assignment pixels is 3×3 will be described below based on comparison with comparative example 1. FIG. 4 shows light receiving areas of right and left viewpoints in the case in which the pixels and the microlens 120M are disposed without position displacement therebetween as comparative example 1. The pixels necessary to acquire light ray data are given numerals for convenience (the same applies also to the subsequent diagrams). If the microlens 120M is disposed without positional displacement relative to the pixel area 13A composed of 3×3 pixels in this manner, the pixel data of the pixels at the positions indicated by "1" and "2" in FIG. 4 are utilized in order to acquire light ray data from right and left two viewpoints. However, in the pixels corresponding to the positions of "1" and "2," light receiving areas $D_R$ and $D_L$ thereof are susceptible to the influence due to the edge of the microlens (the part surrounded by the dashed line in FIG. 4), and thus it is difficult to acquire the desired light ray data with high accuracy.

Figure 5:
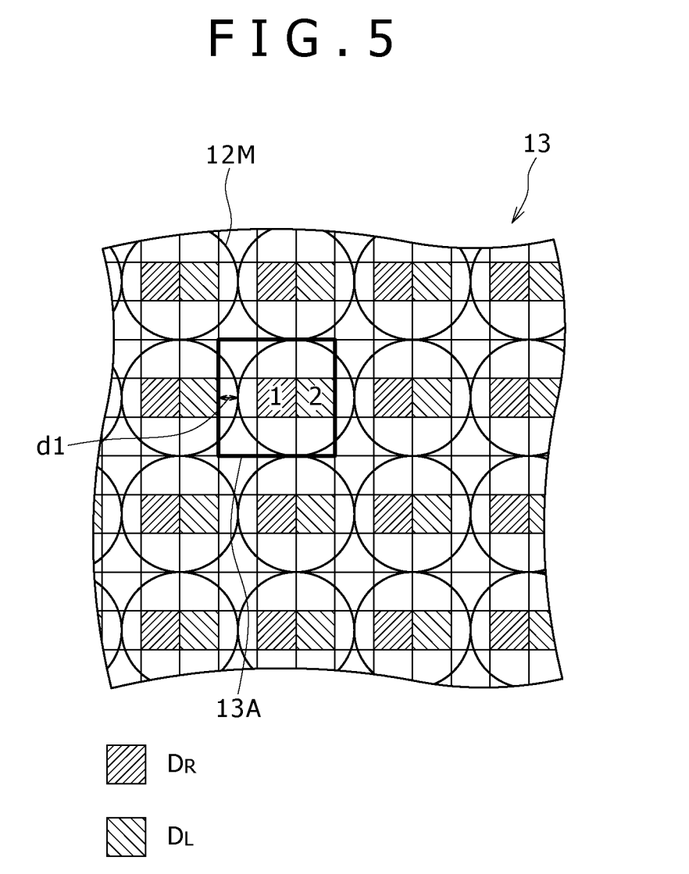
FIG. 5 is a schematic diagram showing light receiving areas of right and left viewpoints in the imaging element shown in FIG. 1.

In contrast, in the present embodiment, the positional displacement d1 is set between the pixel area 13A and the microlens 12A. FIG. 5 shows light receiving areas of right and left viewpoints in the imaging element 13. As shown in FIG. 5, in the present embodiment, the pixel data of the pixels at the positions indicated by "1" and "2" in FIG. 5 are utilized in order to acquire the light ray data of right and left two viewpoints for example. Specifically, due to the positional displacement d1, the light receiving areas $D_R$ and $D_L$ of the pixels of "1" and "2" are less susceptible to the influence due to the edge of the microlens compared with comparative example 1, and thus it is easier to acquire the desired light ray data with high accuracy. Furthermore, if it is intended to acquire light ray data of right and left two viewpoints, the pixel data other than that of the pixels of "1" and "2" are substantially unnecessary. Therefore, it is preferable that only the pixel data of the pixels of "1" and "2," which are necessary, be selectively read out through the driving by the imaging element driver 15.

In addition, because the displacement width of the positional displacement d1 is set to 0.5 Pw, the light ray data of the left viewpoint and that of the right viewpoint can be so acquired as to be symmetric with each other about the optical axis. This feature can reduce the luminance difference between the right and left parallax images and can make the brightness of the respective parallax images uniform.

On the other hand, the color filter (not shown) is disposed on the light receiving plane side of the imaging element 13. Thus, the imaging data D0 is recorded as color data dependent on the color arrangement of this color filter. The imaging data D0 obtained in the above-described manner is output to the image processor 14.

(Image Processing Operation)

The image processor 14 generates e.g. right and left two parallax images based on the imaging data D0. Specifically, from the imaging data D0, the pixel data of the pixels at the same position (in the present embodiment, the pixels at the position of "1" (or "2") in FIG. 5) are extracted for each microlens 12M, and the extracted pixel data are synthesized with each other. The parallax image of the left viewpoint is generated through the synthesis of the pixel data of the pixels at the position of "1" with each other, and the parallax image of the right viewpoint is generated through the synthesis of the pixel data of the pixels at the position of "2" with each other. For these right and left two parallax images, color interpolation processing such as demosaic processing is executed by a color interpolation processor (not shown). Thereby, color parallax images are output as the image data Dout. The image processor 14 may include e.g. a defect detector, a clamp processor, a defect correction processor, a color interpolation processor, a noise reduction processor, a contour enhancement processor, a white balance adjustment processor, and a gamma correction processor (none of them are shown in the diagram).

As described above, in the present embodiment, the microlens array 12 is disposed between the imaging lens 11 and the imaging element 13. Thus, the light rays from the imaging object 2 can be received as light ray vectors whose viewpoints are different from each other. At this time, because the microlens is so disposed as to be displaced along the lateral direction relative to the pixel area 13A having 3×3 pixels, e.g. the light ray data of a left viewpoint and a right viewpoint can be acquired with high accuracy with avoidance of the influence due to the edge of the microlens. Furthermore, in this case, high-speed data processing can be realized if only the necessary pixel data (e.g. the pixel data of the pixels at the positions of "1" and "2" in FIG. 5) are selectively read out. Thus, the light ray data of the desired viewpoint can be acquired with high accuracy and efficiency. Furthermore, this makes it possible to generate parallax images involving less image quality deterioration.

Moreover, the parallax images generated in the above-described manner can be favorably used for three-dimensional image displaying of e.g. the stereo system or the time-division system. As one example of the three-dimensional display system, a system of the general stereo system will be described. In the stereo system, for example, two images for the left eye and the right eye (two parallax images) obtained by photographing by two cameras equivalent to the human eyes are simultaneously projected onto a screen by using two projectors, and a viewer wearing polarizer eyeglasses observes the video on this screen. At this time, for two projectors, polarized light rays orthogonal to each other are used as the projection light rays for the left eye and the right eye, respectively. As the polarizer eyeglasses, ones having the left eyeglass lens and the right eyeglass lens that each transmit only a respective one of the polarized light rays orthogonal to each other are used. By using the polarizer eyeglasses, the viewer observes the image for the left eye by the left eye and observes the image for the right eye by the right eye. This allows the viewer to recognize the images as a three-dimensional image providing a sense of depth.

In the present embodiment, right and left two parallax images can be generated by the imaging device 1, and therefore two cameras like those in the above-described system are unnecessary. Right and left two parallax images generated in the imaging device 1 are projected onto a screen by using a projector like the above-described one and the projected images are observed through polarizer eyeglasses. Thereby, three-dimensional displaying can be realized. Thus, a three-dimensional display system providing favorable display quality can be realized with a simple configuration.

Next, a description will be made below about modification examples (modification examples 1 and 2) regarding the alignment relationship between the imaging element 13 and the microlens 12M in the imaging device 1 of the above-described first embodiment. Modification examples 1 and 2 have the same configuration as that of the imaging device 1 of the above-described first embodiment except for that the alignment relationship between the imaging element 13 and the microlens 12M is different.

Modification Example 1

Figure 6:
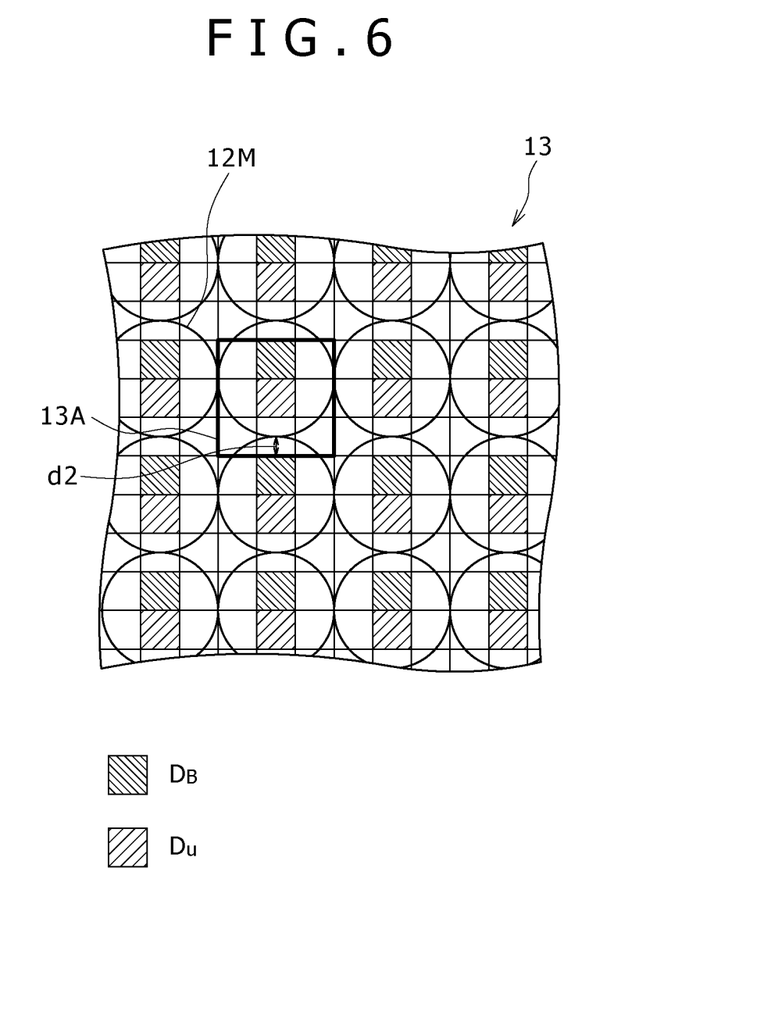
FIG. 6 is a schematic diagram showing the alignment relationship between the imaging element and the microlens and light receiving areas according to modification example 1.

FIG. 6 shows the alignment relationship between the imaging element 13 and the microlens 12M according to modification example 1. In the present modification example, the microlens 12M is disposed in such a state as to be displaced along the longitudinal direction (in this configuration, the vertical direction) relative to the pixel area 13A composed of 3×3 pixels in the imaging element 13 (positional displacement d2). It is preferable that the positional displacement d2 be 0.5 Pw, similarly to the positional displacement d1 in the above-described first embodiment.

In modification example 1, due to such an alignment relationship, the influence due to the edge of the microlens in light receiving areas $D_B$ and $D_U$ of the pixels corresponding to an upper viewpoint and a lower viewpoint is avoided, and the light ray data of upper and lower two viewpoints can be obtained with high accuracy. Furthermore, similarly to the above-described first embodiment, high-speed data processing can be realized if only the pixel data of the pixels corresponding to these upper and lower viewpoints are selectively read out. Thus, the same advantageous effects as those by the above-described first embodiment can be achieved.

Modification Example 2

Figure 7:
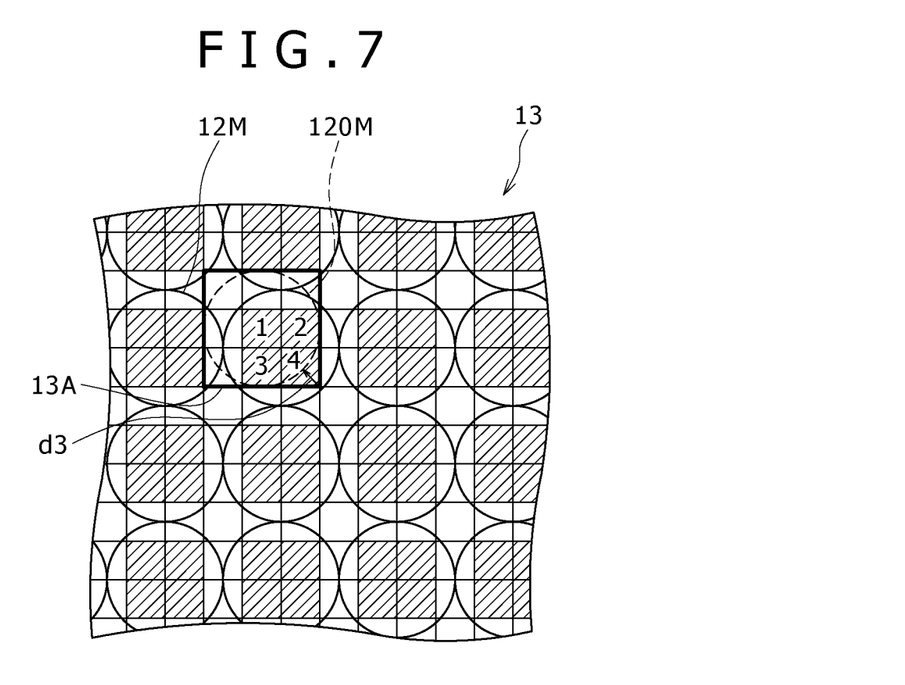
FIG. 7 is a schematic diagram showing the alignment relationship between the imaging element and the microlens and light receiving areas according to modification example 2.

FIG. 7 shows the alignment relationship between the imaging element 13 and the microlens 12M according to modification example 2. In the present modification example, the microlens 12M is disposed in such a state as to be displaced along both of the lateral direction and the longitudinal direction, i.e. along an oblique direction, relative to the pixel area 13A composed of 3×3 pixels in the imaging element 13 (positional displacement d3). The displacement width of the positional displacement d3 is set to such magnitude that the pixels at the respective positions of "1" to "4" move into the area surrounded by the microlens 12M, and preferably to such magnitude that these four pixels are symmetric with each other about the optical axis.

In modification example 2, due to such an alignment relationship, if the number of lens-assignment pixels is 3×3, i.e. 9, the influence due to the edge of the microlens can be avoided in the light receiving areas of four pixels (the pixels of "1" to "4") of these nine pixels. In the case of the alignment relationship in the above-described comparative example 1, i.e. if the microlens is disposed without positional displacement relative to the pixel area 13A, all of nine pixels except for the center pixel, i.e. all of eight peripheral pixels, suffer from the influence due to the edge of the microlens as shown in FIG. 4. Thus, it is difficult to obtain the respective light ray data of many viewpoints with high accuracy. In contrast, the alignment relationship of the present modification example makes it possible to acquire the light ray data of at least four viewpoints with high accuracy. Furthermore, high-speed data processing can be realized if only these four pixel data are selectively read out. Thus, the same advantageous effects as those by the above-described first embodiment can be achieved.

Second Embodiment

Figure 8:
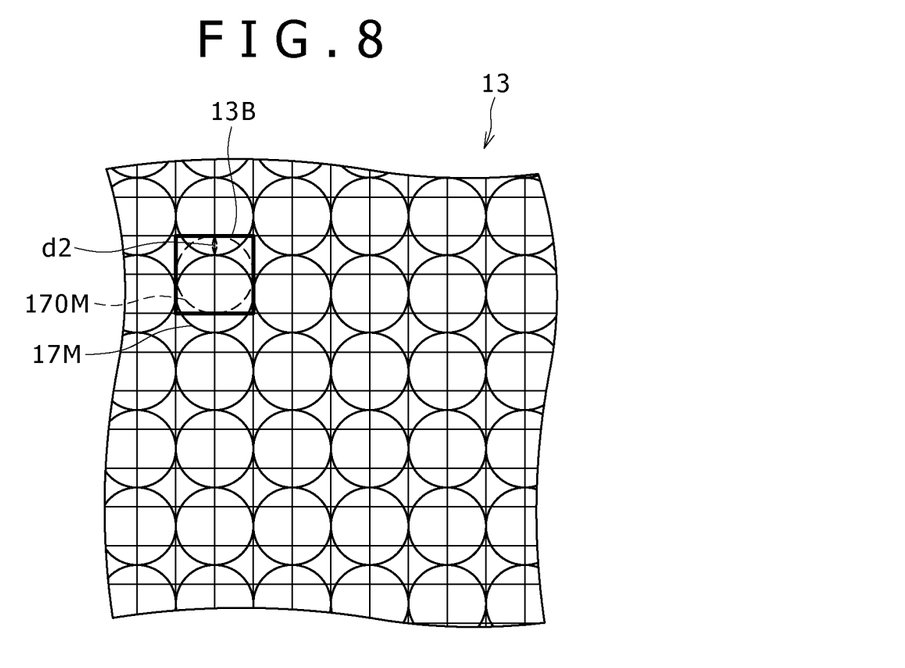
FIG. 8 is a schematic diagram for explaining the alignment relationship between an imaging element and a microlens according to a second embodiment.

FIG. 8 shows the alignment relationship between the imaging element and the microlens according to a second embodiment. The present embodiment has the same configuration as that of the above-described first embodiment except for the number of lens-assignment pixels and the alignment relationship between the imaging element 13 and a microlens 17M. That is, the alignment relationship according to the present embodiment is applied to the imaging device 1 according to the above-described first embodiment. In the following description, the same components as those in the above-described first embodiment are given the same numerals and symbols, and the description thereof is accordingly omitted.

(Alignment Relationship between Imaging Element 13 and Microlens 17M)

In the present embodiment, the number of lens-assignment pixels is 2×2 (4). In this case, generally the microlens (microlens 170M) is so disposed as to involve no positional displacement relative to a pixel area 13B surrounded by the heavy-line frame in FIG. 8 for example. Due to this configuration, the light ray passing through a respective one of the microlenses is received by each of four pixels in the pixel area 13B.

In the present embodiment, positional displacement d2 is set between the pixel area 13B composed of 2×2 pixels and the microlens (microlens 17M). Specifically, the microlens 17M is disposed in such a state as to be displaced along the longitudinal direction (in this configuration, the vertical direction) relative to the pixel area 13B.

(Operation and Effects of Second Embodiment)

Figure 9:
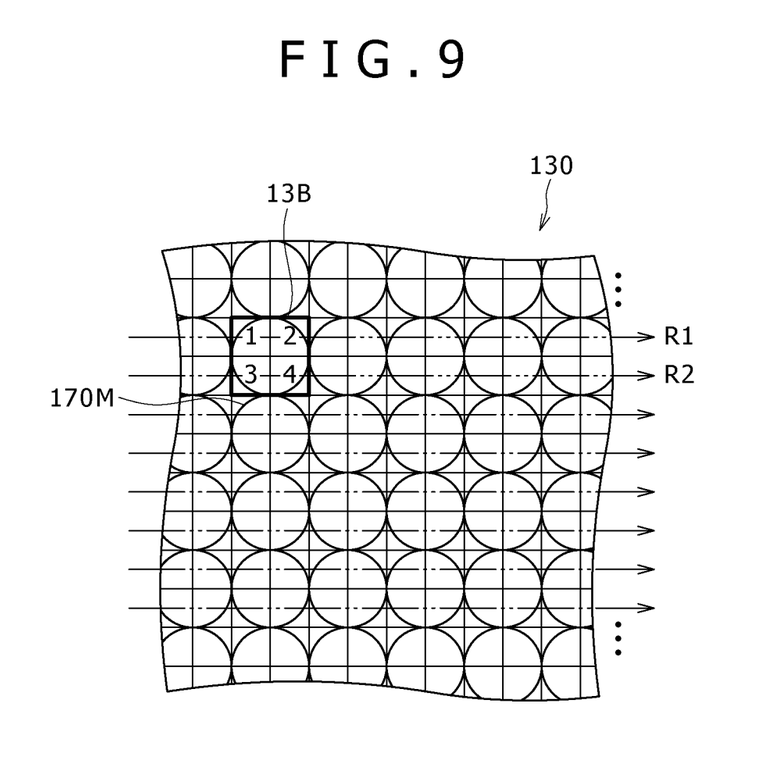
FIG. 9 is a schematic diagram for explaining the readout operation of the imaging element according to comparative example 2.
Figure 10:
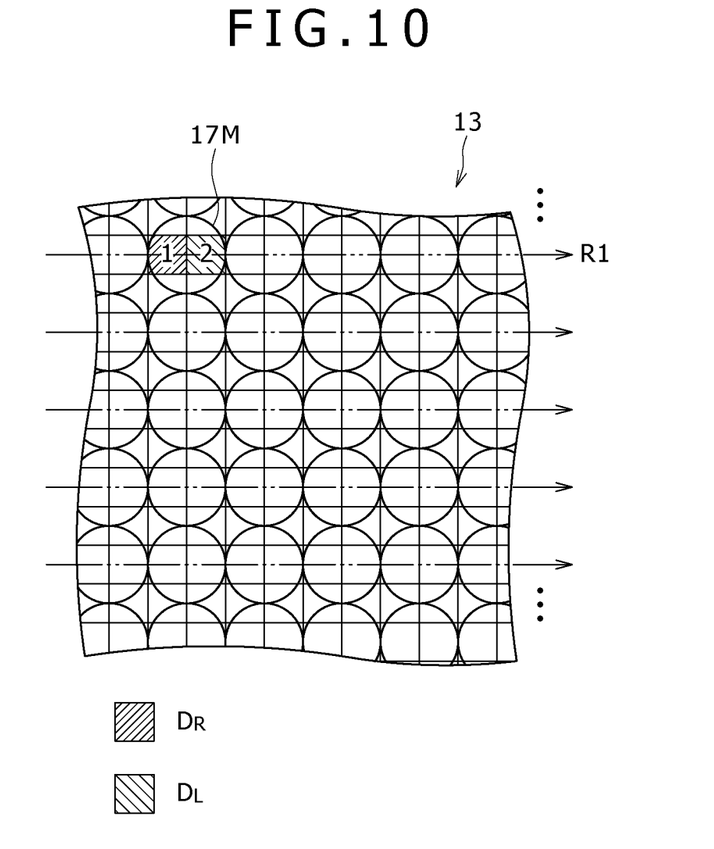
FIG. 10 is a schematic diagram for explaining the readout operation of the imaging element shown in FIG. 8.

The operation and effects of the present embodiment will be described below based on comparison with comparative example 2. FIG. 9 is a diagram for explaining readout operation in the case in which an imaging element 130 and the microlens 170M are disposed without positional displacement therebetween as comparative example 2. FIG. 10 is a diagram for explaining readout operation in the present embodiment.

In the present embodiment, in the imaging element 13, the light ray data of the imaging object 2 from right and left two viewpoints are acquired similarly to the above-described first embodiment. In comparative example 2 shown in FIG. 9, in order to obtain the light ray data of right and left two viewpoints symmetric with each other about the optical axis, the pixel data of the pixels on the same longitudinal line, i.e. the pixel data of the pixels of "1" and "3" and the pixel data of the pixels of "2" and "4" in FIG. 9, need to be integrated. Thus, the pixel data of all of the lens-assignment pixels of "1" to "4" need to be read out, and therefore two readout lines (R1 and R2) are necessary for each of the microlenses 170M. Furthermore, in comparative example 2, the influence due to the edge of the microlens 170M is large in all of the pixels of "1" to "4," and therefore it is difficult to acquire the light ray data with high accuracy. Moreover, the integration processing is executed for these four pixel data. This causes disadvantages not only that the number of steps of the processing is increased but also that the depth of field of parallax images is small if the parallax images are generated in the image processing at the subsequent stage.

In contrast, in the present embodiment, the light ray data of right and left two viewpoints symmetric with each other about the optical axis can be obtained by reading out the pixel data of the pixels at the positions of "1" and "2" for each of the microlenses 17M as shown in FIG. 10. That is, by utilizing the alignment relationship involving the positional displacement d2, readout by one readout line R1 for each of the microlenses 17M is permitted. Thus, high-speed data processing can be realized through selective readout of only the necessary pixel data. In addition, in this case, the integration processing like that in the above-described comparative example 2 is also unnecessary, and thus parallax images whose depth of field is large can be generated.

Furthermore, in the configuration of FIG. 10, although the light receiving areas $D_R$ and $D_L$ of the pixels at the positions of "1" and "2" slightly suffer from the influence due to the edge of the microlens, the influence can be reduced compared with the above-described comparative example 2. Thus, also in the present embodiment, the light ray data of the desired viewpoint can be acquired with high accuracy and efficiency similarly to the above-described first embodiment.

Modification Example 3

Figure 11:
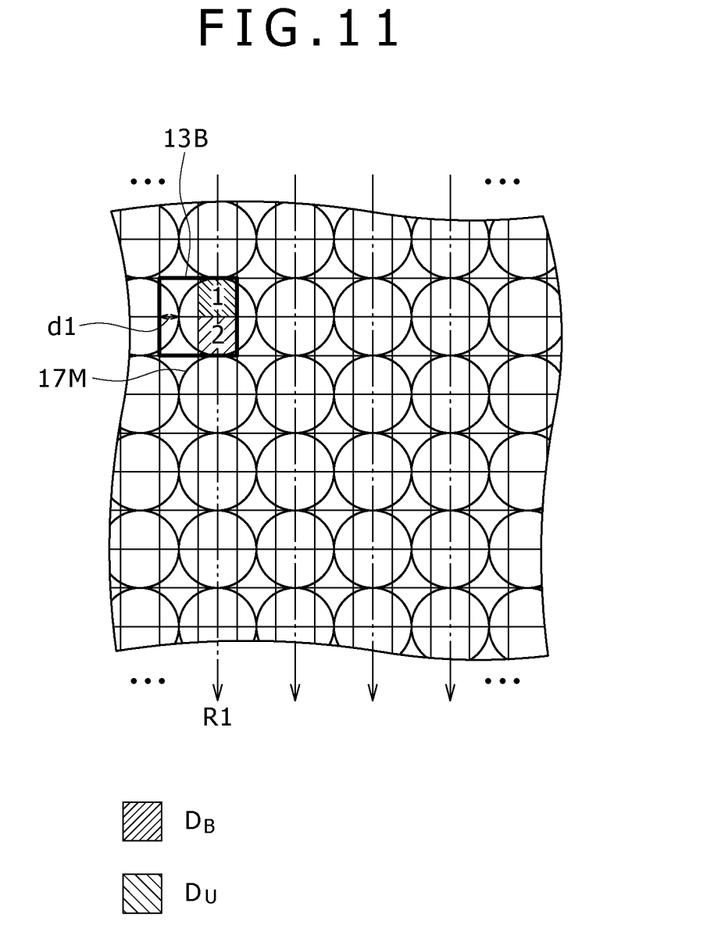
FIG. 11 is a schematic diagram for explaining the alignment relationship between the imaging element and the microlens and readout operation according to modification example 3.

FIG. 11 shows the alignment relationship between the imaging element 13 and the microlens 17M according to modification example 3. In the present modification example, the microlens 17M is disposed in such a state as to be displaced along the lateral direction (in this configuration, the horizontal direction) relative to the pixel area 13B composed of 2×2 pixels in the imaging element 13 (positional displacement d1).

In modification example 3, due to such an alignment relationship, for example the influence due to the edge of the microlens is reduced in the light receiving areas $D_B$ and $D_U$ of the pixels corresponding to an upper viewpoint and a lower viewpoint (the pixels at the positions of "1" and "2" in FIG. 11), which makes it easier to obtain the light ray data of upper and lower two viewpoints with high accuracy. Furthermore, only the necessary pixel data of the pixels at these positions of "1" and "2" can be read out by one readout line R1, and therefore high-speed data processing can be realized. Thus, the same advantageous effects as those by the above-described second embodiment can be achieved.

Although the embodiments and modification examples thereof have been described above, the present invention is not limited to the above-described embodiments but various modifications can be incorporated therein. For example, the above embodiments have been described by taking as an example the case in which the number of lens-assignment pixels (m×n) is 2×2 or 3×3. However, the number of lens-assignment pixels is not limited thereto but m and n may be equal to or larger than 4.

Furthermore, the above embodiments have been described by taking as an example the case in which the parallax images generated from the imaging data acquired in the imaging element 13 are applied to three-dimensional displaying of the stereo system. However, the parallax images obtained in the embodiments of the present invention can be used also for other purposes as well as the above-described three-dimensional displaying. For example, it is also possible to obtain information on the distance to the measurement object by generating at least two parallax images based on imaging data by a method like the above-described one and executing predetermined correlation calculation processing based on these parallax images.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is as follows:

1. An imaging device comprising:
an imaging lens configured to have an aperture stop;
an imaging element configured to include a plurality of pixels two-dimensionally arranged along a longitudinal direction and a lateral direction and acquire imaging data based on received light; and
a microlens array configured to be disposed between the imaging lens and the imaging element and include a plurality of microlenses,
wherein the imaging element includes a pixel area composed of m×n pixels, m and n denoting a number equal to or larger than 2 in the longitudinal direction and the lateral direction, in the imaging element being assigned to a respective one of the microlenses, and wherein
positional displacement is set between the microlens and the pixel area such that at least two pixels in the pixel area are aligned with a center portion of the microlens; and wherein displacement width of the positional displacement is 0.5 Pw, where Pw is pixel width.

2. The imaging device according to claim 1, wherein the positional displacement is set along the longitudinal direction, the lateral direction, or an oblique direction.

3. The imaging device according to claim 1, wherein each of the m and the n is 3 and the positional displacement is set along a horizontal direction.

4. The imaging device according to claim 1, wherein each of the m and the n is 2 and the positional displacement is set along a vertical direction.

5. The imaging device according to claim 1, further comprising
an image processor configured to extract each of pixel data of pixels disposed at the same position among the plurality of microlenses based on imaging data acquired by the imaging element, and synthesize the extracted pixel data with each other to generate a plurality of parallax images.

6. The imaging device according to claim 1, further comprising
an imaging element driver configured to drive the imaging element in such a way that readout of pixel data is selectively carried out for only some pixels among the plurality of pixels.

7. The imaging device according to claim 1, wherein the positional displacement is set between the microlens and the pixel area such that at least two pixels in the pixel area are not susceptible to light effects from an edge of the microlens.

8. The imaging device according to claim 1, wherein the displacement width of the positional displacement is 0.5 Pw when m and n are both equal to three.

* * * * *